(12) United States Patent
Tsumura et al.

(10) Patent No.: US 8,377,822 B2
(45) Date of Patent: Feb. 19, 2013

(54) SEMICONDUCTOR DEVICE AND MANUFACTURING METHOD THEREOF

(75) Inventors: Kazumichi Tsumura, Guilderland, NY (US); Takamasa Usui, Selkirk, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 12/784,868

(22) Filed: May 21, 2010

(65) Prior Publication Data
US 2011/0285024 A1    Nov. 24, 2011

(51) Int. Cl.
*H01L 23/52*    (2006.01)
*H01L 21/4763*    (2006.01)

(52) U.S. Cl. ........... 438/644; 257/773; 257/E21.495; 438/618; 438/625; 438/642; 438/643; 438/652; 438/653; 438/654

(58) Field of Classification Search .......... 438/618, 438/625, 642, 643, 644, 652, 653, 654; 257/773, 257/E21.495
See application file for complete search history.

(56) References Cited

U.S. PATENT DOCUMENTS

| 7,304,384 B2 | 12/2007 | Koike et al. |
| 2008/0057704 A1 | 3/2008 | Koike et al. |
| 2009/0146309 A1 | 6/2009 | Kudo et al. |

FOREIGN PATENT DOCUMENTS

JP    2009-164354    7/2009

*Primary Examiner* — Peniel M Gumedzoe
(74) *Attorney, Agent, or Firm* — Turocy & Watson, LLP

(57) ABSTRACT

A semiconductor structure having a cap layer formed over a metalized dielectric layer is formed by depositing manganese on the surface of the metalized dielectric layer. The deposited manganese serves as a first cap layer to remove oxidation on the surface of the metalized dielectric layer. The presence of oxidation on the surface of the metalized dielectric layer can be delirious for performance of a device constructed out of the semiconductor structure. A second cap layer is then formed by depositing silicon carbide or nitrogen enriched silicon carbide over the first cap layer.

15 Claims, 6 Drawing Sheets

SEMICONDUCTOR DEVICE AND MANUFACTURING METHOD THEREOF

FIELD

Described are semiconductor structures and methods for forming semiconductor devices having a manganese-based cap layer formed over a copper-based interconnection for improved electromigration reliability.

BACKGROUND

Due to the decreasing scale of modern semiconductor devices, the efficiency of signal transmission along metallic interconnect lines has become a factor in the performance of semiconductor devices. For this reason, copper is increasing used in replace of aluminum due to the higher conductivity and correspondingly increased efficiency in signal transmission using copper. Copper-based interconnect lines are formed by patterning a series of trenches and/or vias into a dielectric layer. Copper is typically placed to form interconnection lines through a damascene (or inlaid) technique to fill recesses formed in the dielectric layer of a back-end-of-line (BEOL) structure. Multiple layers of interconnection lines can be formed by placing a cap layer followed by further deposition of dielectric material into which trenches and vias can be formed. The cap layer can serve the function of an etch stop during pattering of an overlaid dielectric layer. As such, multiple metalized layers can be formed.

While copper offers good conductive qualities, copper can pose various challenges that complicate the fabrication of semiconductor structures. Copper has the ability to diffuse into surrounding dielectric material. Even minute quantities of copper diffused into a dielectric layer poison the dielectric layer and lead to unpredictable performance. Therefore, a barrier material is often used to line a trench and/or via to protect the surrounding dielectric layer from copper diffusion. Similarly, the cap layer placed over the copper-based interconnection lines also serves to prevent diffusion into an overlying dielectric layer. Copper is also highly sensitive to oxidation and easily forms a film of copper oxide, particularly during the numerous heating steps that are employed in the fabrication of semiconductor structures. In a finished semiconductor structure, the copper-based interconnection lines have to be scrupulously guarded from oxygen and moisture to prevent oxidation over time, which is a further function performed by the cap layer.

Oxidation of copper-based components in a semiconductor structure can lead to several delirious effects. For example, copper oxide films exhibit poor adhesion to surrounding materials, such as dielectric materials, materials used as a copper diffusion barrier, and cap layer materials. To address the problem of poor adhesion to a cap layer, plasma gas treatments and/or plasma enhanced chemical vapor deposition (PECVD) are often employed to remove the copper oxide film and place a cap layer with good adhesion. Due to the shrinking dimensions of semiconductor structures, low-k materials are frequently used as a replacement for silicon dioxide to reduce parasitic capacitance between closely spaced interconnection lines. Newer low-k materials are susceptible to damage from plasma treatments employed to eliminate copper oxide and improve adhesion.

The current densities carried by the metallic interconnect lines increase as the cross-sectional area of the metallic interconnect lines is made smaller. The decreasing mass of individual metallic interconnect lines gives rise to complications from electromigration (EM). At higher current densities, the increased kinetic energy of individual electrons can result in significant momentum transfer to individual metal atoms within the metallic interconnect line. Over time, a mass transfer in the direction of electron movement can occur overtime as the result of high current densities. Poor EM reliability can be moderated by high-quality adhesion between any metallic-based interconnection line, including copper-based interconnection lines, and the surrounding materials.

DETAILED DESCRIPTION

A cap layer is formed over a dielectric layer having interconnection lines formed from copper or a copper alloy without the use of a cleaning plasma or a plasma deposition process. The surface of copper-containing interconnection lines has a natural tendency to oxidize, which is delirious to adhesion between the cap layer and the oxidized copper regions. Poor adhesion with the cap layer can lead to electromigration and poor reliability of fabricated semiconductor devices. The use of a plasma gas to remove oxidized copper regions can damage the dielectric layer.

Metallic interconnection lines are formed within at least one or more trenches and/or vias formed in a dielectric layer placed over a semiconductor substrate. Manganese is deposited to cover at least a portion of the dielectric layer having a metallic interconnection line formed therein and at least a portion of the metallic interconnection line to form a first cap layer. The manganese is deposited without any prior plasma-based process or contact between the dielectric layer and a plasma gas. The deposited manganese forms a first cap layer, where at least a portion of the manganese forming the first cap layer oxidizes to form a manganese oxide while reducing the oxidized copper regions on a surface of the interconnection lines. One or more selected from silicon carbide and nitrogen enriched silicon carbide is then deposited over the first cap layer to form a second cap layer.

Interconnection lines are formed by inlaying a copper-based or other metallic material into a pattern of trenches and/or vias in a dielectric layer.

Figure 1:
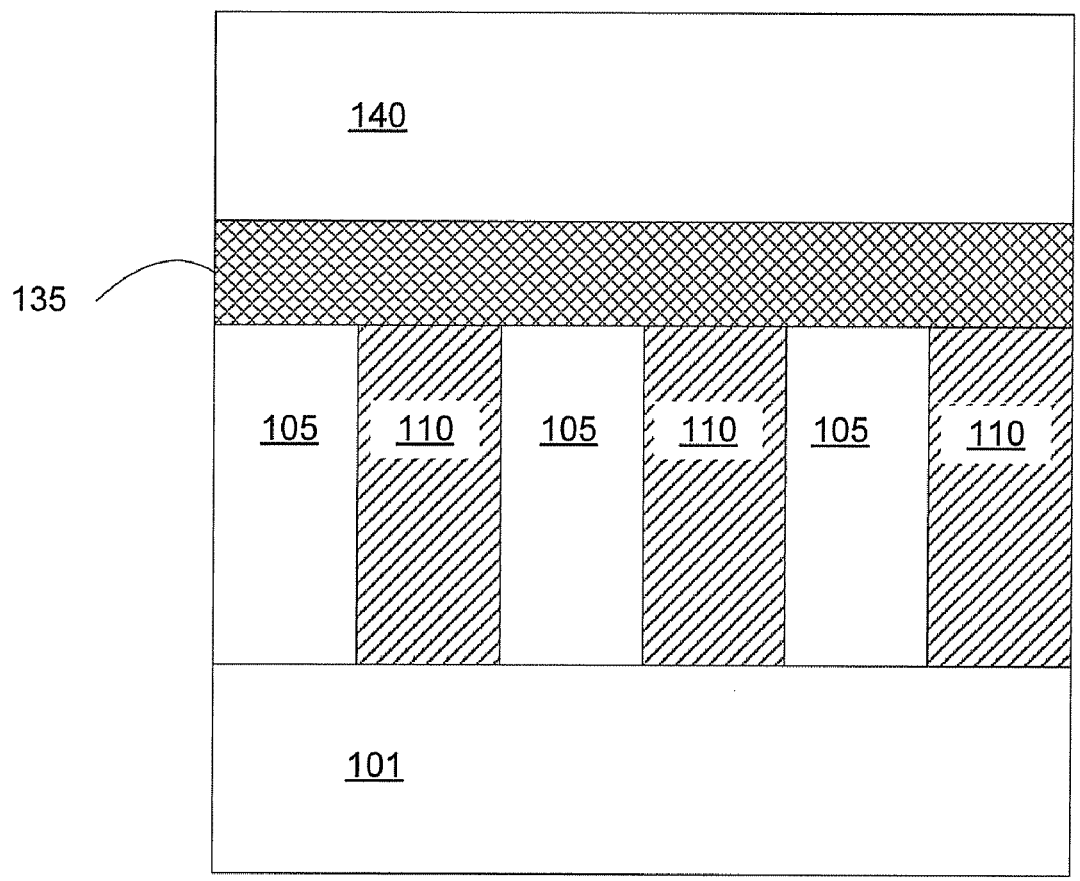
FIG. 1 is an illustration of a prior art semiconductor structure having a single silicon carbide-based cap layer.

As shown in FIG. 1A, a plurality of copper-based interconnection lines 105 are formed in a dielectric layer 110. For simplicity, the interconnection lines 105 are shown as individual trenches 105; those skilled in the art will readily understand that the innovations disclosed herein are readily applicable to more complicated patterns of trenches and vias. Due to the propensity of copper to diffusion into the surround dielectric layer 110, the trenches and/or vias into which the copper-based interconnection lines are formed are typically lined with a barrier metal layer (not shown). Materials from which the barrier metal layer can be formed include one or more of tantalum, tantalum nitride, titanium, titanium nitride and combinations thereof. The barrier metal layer can be placed using well-known techniques including sputter deposition, CVD, atomic layer deposition (ALD) and the like. The interconnection lines 105 are placed by well-known electroplating and damascene techniques. The interconnections lines 105 and dielectric layer are formed over a semiconductor substrate 101 upon which transistors, capacitors, and/or other device structures are formed.

In one embodiment, the width of the interconnection lines 105 is from about 25 to about 60 nm. In another embodiment, the width of the interconnection lines is from about 30 to about 55 nm. In yet another embodiment, the width of the interconnection lines is from about 30 to about 50 nm.

During processing of the semiconductor structure, the surfaces of the copper-based interconnection lines 105 are particularly susceptible to oxidation and forming a film of copper oxide thereon. In order to protect the copper based interconnection lines 105 from oxidation, a cap layer 135 is typically placed over the copper-based interconnection lines 105. The cap layer serves as a barrier to prevent both the diffusion of water and oxygen that can cause oxidation, and also to prevent the diffusion of copper into a second dielectric layer 140 formed over the cap layer 135, which can be used to form an additional level of interconnection lines.

Figure 2:
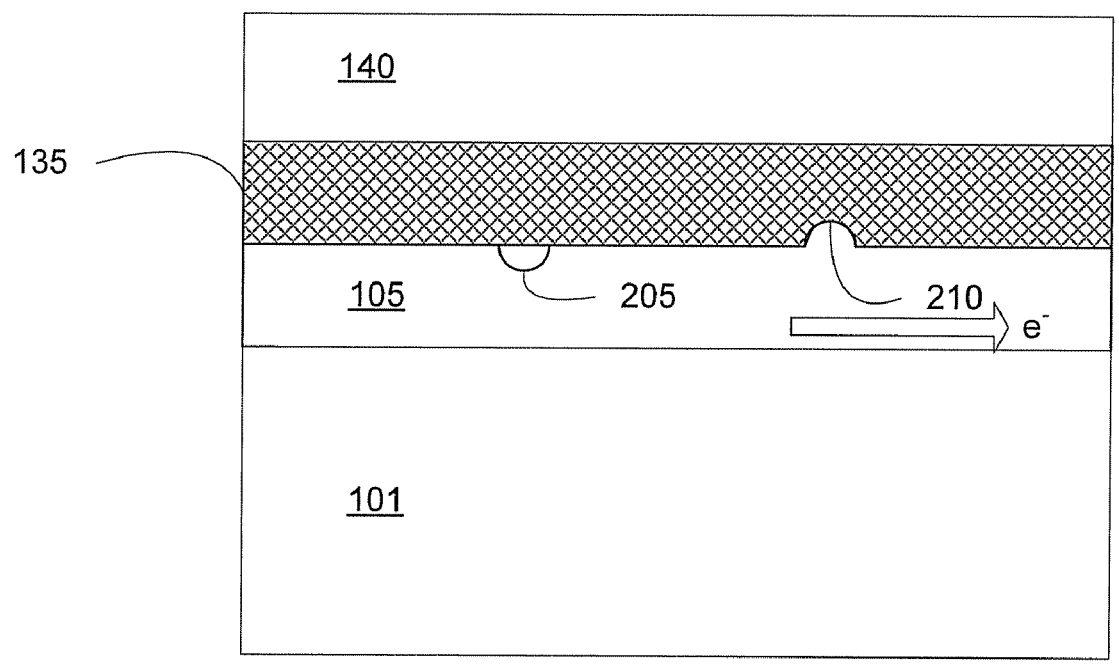
FIG. 2 is an illustration of prior art semiconductor structure having defects caused by electromigration.

The cap layer 135 is typically formed from nitrogen enriched silicon carbide (SiCN) although silicon nitride (SiN) can also be used. SiCN-based and SiN-based cap layers can exhibit poor adhesion to a copper interconnection line that has oxidized copper present on at least a portion of the surface of the interconnection line and a cap layer. As shown in FIG. 2, poor adhesion between the cap layer 135 and a copper interconnection 105 line allows voids 205 and/or hillocks 210 to form resulting in poor EM reliability, where the arrow indicates the direction of electron flow. FIG. 2 shows a cross-section of a semiconductor structure along a copper interconnect line 105; the dielectric layer 110 is not shown. Poor adhesion allows hillocks 210 to form upstream of electron flow since the adhesion barrier between the cap layer 135 and the interconnection line 105 is not sufficient to oppose the momentum transfer to copper atoms due to high current density. As mass is transferred upstream of electron flow, voids 205 can appear downstream.

Adhesion between a copper interconnection line 105 and a cap layer 135 can be improved by reduction or eliminating the presence of copper oxide on the surface (for example on the top surface) of the copper interconnection line 105. The oxide layer present on the surface of the copper interconnection line 105 is a natural oxide layer that is formed by the exposure of the interconnection line 105 to oxygen in the atmosphere. The natural oxide layer is not formed deliberately. Rather, the natural oxide layer is a result of the unavoidable exposure of the copper interconnection line 105 to atmospheric oxygen during the processing of the semiconductor structure.

Typically, a copper-based material is placed into the trenches and/or vias formed in dielectric layer 110 by electroplating or other appropriate technique. The electroplated copper-based material is then leveled using chemical mechanical polishing (CMP), which exposes a fresh copper surface. However, the copper surface can easily react with moisture, oxygen, fluorine and trace gases to form a copper oxide or other oxidized copper species on the surface of the copper interconnection line 105. Prior to deposition of a cap layer 135, a cleaning technique is often employed to remove copper oxide and other oxidized copper species.

Typical cleaning processes employ the use of a plasma-based treatment applied to the surface of the copper interconnection lines 105 to remove oxidized copper species prior to deposition of the cap layer 135. A common plasma treatment is ammonia and nitrogen gas with plasma ignition by radio frequency. Further, SiCN, SiC or other appropriate cap layer materials are often deposited through the use of plasma enhanced chemical vapor deposition (PECVD), wherein a precursor gas such as trimethylsilane and ammonia are combined and an appropriate radio frequency is applied to form a plasma from which a silicon carbide can be deposited to form the cap layer 135. The cap layer 135 material is an insulator and can be a material other than silicon carbide or nitrogen enriched silicon carbide; the cap layer 135 material is not limited to any specific material.

Many low-k materials have a high susceptibility to damage from exposure to plasma. In the process of exposing the interconnection lines to a cleaning plasma and/or during PECVD, the plasma contacts both the interconnection lines and the surround dielectric layer which can be formed from low-k materials. As defined herein, a low-k material is defined as any dielectric material having a dielectric constant less than the dielectric constant of silicon dioxide. Low-k materials are increasingly used to reduce capacitance between adjacent interconnection lines as placement of the interconnection lines 105 becomes closer due to decreasing device size. Exposure of low-k materials to plasma can have the delirious effect of increasing the dielectric constant of the materials thereby making the low-k materials less effective at reducing capacitance.

Devices formed using copper-based interconnection lines placed in a dielectric layer having low-k materials are also susceptible to time dependent dielectric breakdown (TDDB). The copper-based interconnection lines are separated from the dielectric layer by a barrier metal layer or liner to prevent diffusion of copper into the dielectric layer. TDDB is a measurement of the reliability of the barrier metal layer or liner to prevent diffusion over time. Exposure of the dielectric layer, barrier metal layer or liner and/or interconnection lines to plasma increases the rate of TDDB in the device. That is, the use of plasma-based processes in removing oxidation and/or depositing a cap layer over the dielectric layer having interconnection lines formed therein increases the rate of diffusion of metal into the dielectric layer. The use of plasma-based processes also contributes to the formation of leak currents. As such, the use of plasma-based cleaning processes to remove oxidation and/or plasma-based deposition processes, such as PECVD, decreases the functional lifetime of semiconductor devices. An increase in the rate of TDDB can be avoided by removal of undesirable oxidation and placement of a cap layer without exposure of the dielectric layer and/or interconnection lines to a plasma gas prior to placing a cap layer over the dielectric layer.

In one embodiment, a low-k material forming a dielectric layer of a semiconductor structure has a dielectric constant that is not increased due to plasma damage. In another embodiment, a low-k material forming a dielectric layer of a semiconductor structure has a dielectric constant that is substantially equal to the native dielectric constant characteristic of that low-k material. That is, the low-k material does not exhibit signs of plasma damage.

Specific embodiments in accordance with the innovations disclosed herein will be described. The innovations disclosed herein allow for the placement of one or more cap layers between metalized layers of a semiconductor structure without the use of any plasma. As defined herein, plasma is a gas that has been partially ionized such that the plasma responds to an electromagnetic field. In one instance, plasma is at least about 0.1% or more ionized. In another instance, plasma comprises ionized ammonia gas.

Those skilled in the art will recognize that well-known semiconductor fabrication techniques including depositing materials, masking, photolithography, etching, and implanting are useful in forming the described devices or structures. Deposition of materials for forming semiconductor structures can be by low pressure chemical vapor deposition, chemical vapor deposition, atomic layer deposition, and the like. Conserved reference numbers match like elements.

Terms, such as "on," "above," "below," and "over," used herein, are defined with respect to the plane defined by the surface of a semiconductor substrate. The terms "on," "above," "over," etc. indicate that the subject element is farther away from the plane of the semiconductor substrate than another element referred to as a spatial reference. The term "below" and similar terms indicate that the subject element is closer to the plane of the semiconductor substrate than another element referred to as a spatial reference. The terms "on," "above," "below," and "over," etc. only indicate a relative spatial relationship and do not necessarily indicate that any particular elements are in physical contact. The preceding definitions apply throughout this document.

Figure 3:
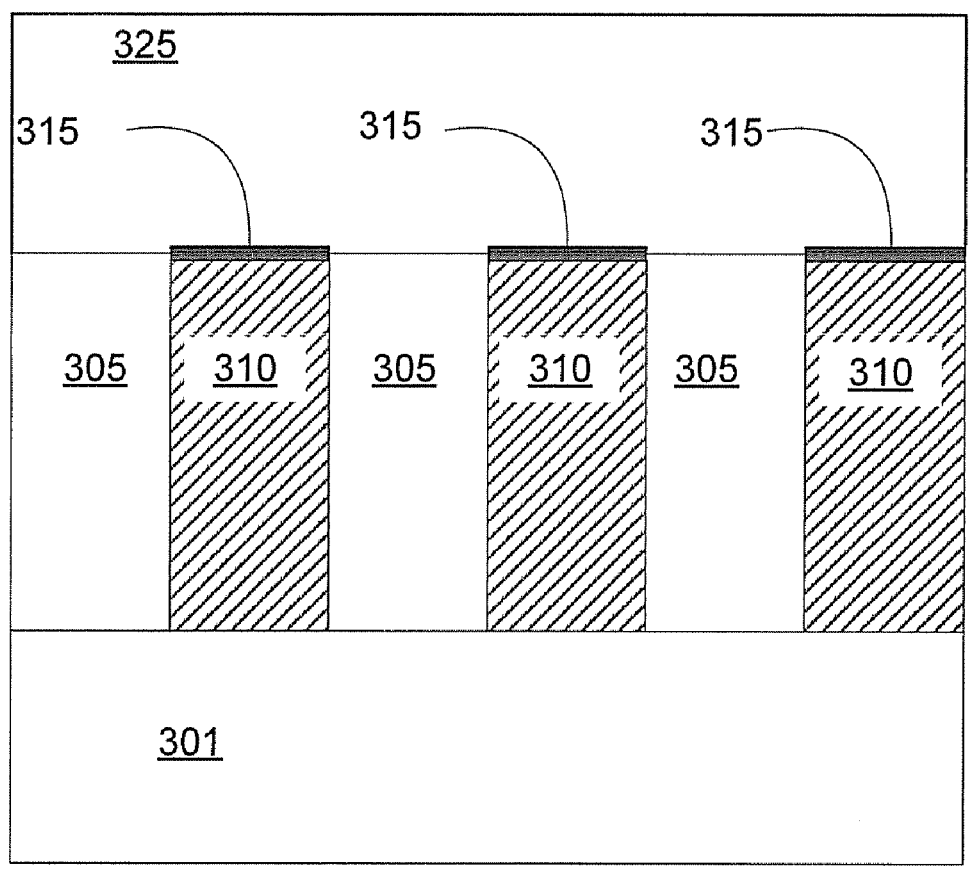
FIG. 3 is an illustration of semiconductor structure having an oxidized surface useful for practicing aspects of the innovations disclosed herein.

In FIG. 3, an embodiment semiconductor having a dielectric layer is shown. A dielectric layer 305 is shown formed over a semiconductor substrate 301. The cross-section view of the structure in FIG. 3 shows multiple separate metallic interconnection lines 310 within the dielectric layer 305. The interconnection lines 310 are formed by known damascene, dual damascene and/or electroplating techniques. In one embodiment, the interconnection lines 310 comprise at least about 50% by weight of copper.

Copper has a natural tendency to oxidize. The oxidation of copper is promoted by the many heating steps that are performed during semiconductor fabrication. Formation of oxidized copper on the surface 315 of the interconnection lines 310 is not a deliberate or desired result; rather, the formation of oxidized copper is an unwanted byproduct of conventional semiconductor processing techniques.

Copper can be oxidized to a +1 and/or a +2 oxidation state. As defined herein, oxidized copper is any compound containing $Cu^+$ or $Cu^{2+}$. In one embodiment, a portion of the surface 315 of the interconnection lines 310 has film of copper oxide (CuO). In another embodiment, oxidized copper can be present on the surface 315 of the interconnection line 310 is a form of oxidized copper other than CuO, such as a copper halide.

As discussed above, a cap layer 325, which corresponds to cap layer 135, is placed over the dielectric layer 305 containing the interconnection lines 310 to protect the interconnection lines 310 from further damage from oxidation that can be promoted by contact with air and moisture and to separate dielectric layer 305 from any overlaying dielectric layers. As mentioned, the presence of a film of oxidized copper on the surface 315 of the interconnection lines 310 adversely affects adhesion between the cap layer and the copper interconnection lines 310 that can lead to poor EM reliability.

Figure 4:
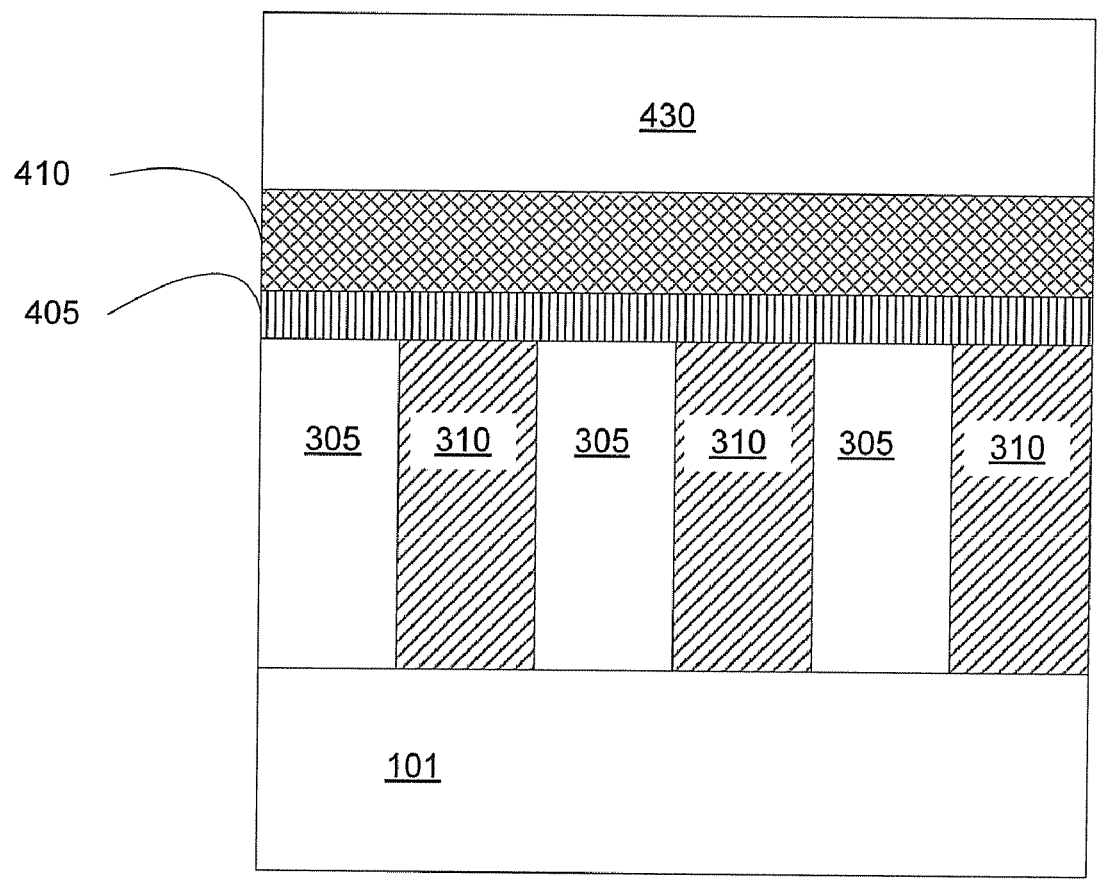
FIG. 4 is an illustration of a semiconductor structure in accordance with aspects of the innovations disclosed herein.

In FIG. 4, a layer of manganese 405 is deposited over the dielectric layer 305 and interconnection lines 310 by known techniques, such as vapor chemical deposition and/or thermal vapor chemical deposition. Manganese is deposited as reduced elemental manganese. Those skilled in the art will recognize that deposition techniques other than vapor chemical deposition can be employed in order to achieve the benefits disclosed herein. The deposited elemental manganese is capable of acting as a reducing agent, where manganese undergoes oxidation while reducing another species. As such, a portion of the deposited manganese 405 reduces the oxidized copper film present of the surface 315 of the interconnection lines 310. When oxidized copper is present on the surface 315 of the interconnection lines 310, a portion of the deposited manganese 405 is oxidized to $MnO_x$, wherein O originates from the oxide film present of the surface 315 of the interconnection lines 310 and x is from about 1 to about 3.5. In another embodiment, x is from about 1 to about 2. That is, a reduction/oxidation reaction occurs between the deposited manganese 405 and the oxidized copper film on the surface 315 of the interconnection lines 310 to regenerate elemental copper and to eliminate the copper oxide film while oxidizing at least a portion of the deposited manganese 405.

At least a portion of the interface between the deposited manganese 405 and the interconnection lines 310 is characterized by the contact of copper or a copper alloy free of an oxidized copper film with a layer having manganese oxide ($MnO_x$). The deposited manganese 405 forms a first cap layer over the dielectric layer 305, where the first cap layer 405 contains $MnO_x$. The interface between $MnO_x$ and copper or copper alloy has strong adhesion, which increases EM reliability. As such, a first cap layer 405 is formed over the dielectric layer 305 without the use of any plasma or contact between plasma and the dielectric layer 305 prior to the act of depositing the manganese forming the first cap layer 405. As such, the dielectric layer 305 is not subjected to any plasma damage and any low-k material forming the dielectric layer 305 has the intrinsic dielectric constant for that particular low-k material which is not increased due plasma damage.

As shown in FIG. 4, a second cap layer 410 is formed over the first cap layer 405 after the act of manganese deposition. In one embodiment, the second cap layer contains a traditional SiC and/or SiCN material that can be placed using known techniques. Both the first and second cap layers have barrier properties that both protect against oxidation of copper in the interconnection lines 310 and prevent the diffusion of copper into any overlaying dielectric layer 430. Through the use of two cap layers, the benefits of the superior barrier properties of traditional materials such as SiC or SiCN can be utilized while superior adhesion is provided by $MnO_x$ present in the first cap layer. The reaction between the natural oxide layer and/or oxidized copper 315 present of the surface of the interconnection line 310 can occur before formation of the second cap layer 410. Alternatively, the reaction between the natural oxide layer and/or oxidized copper 315 present of the surface of the interconnection line 310 can occur or continue to occur after formation of the second cap layer 410.

In one embodiment, the average thickness of the second cap layer is from about 10 to about 50 nm. In another embodiment, the average thickness of the second cap layer is from about 15 to about 40 nm. In one embodiment, the first cap layer has an average thickness from about 1 to about 10 nm. In another embodiment, the first cap layer has an average thickness from about 1 to about 5 nm.

Figure 5:
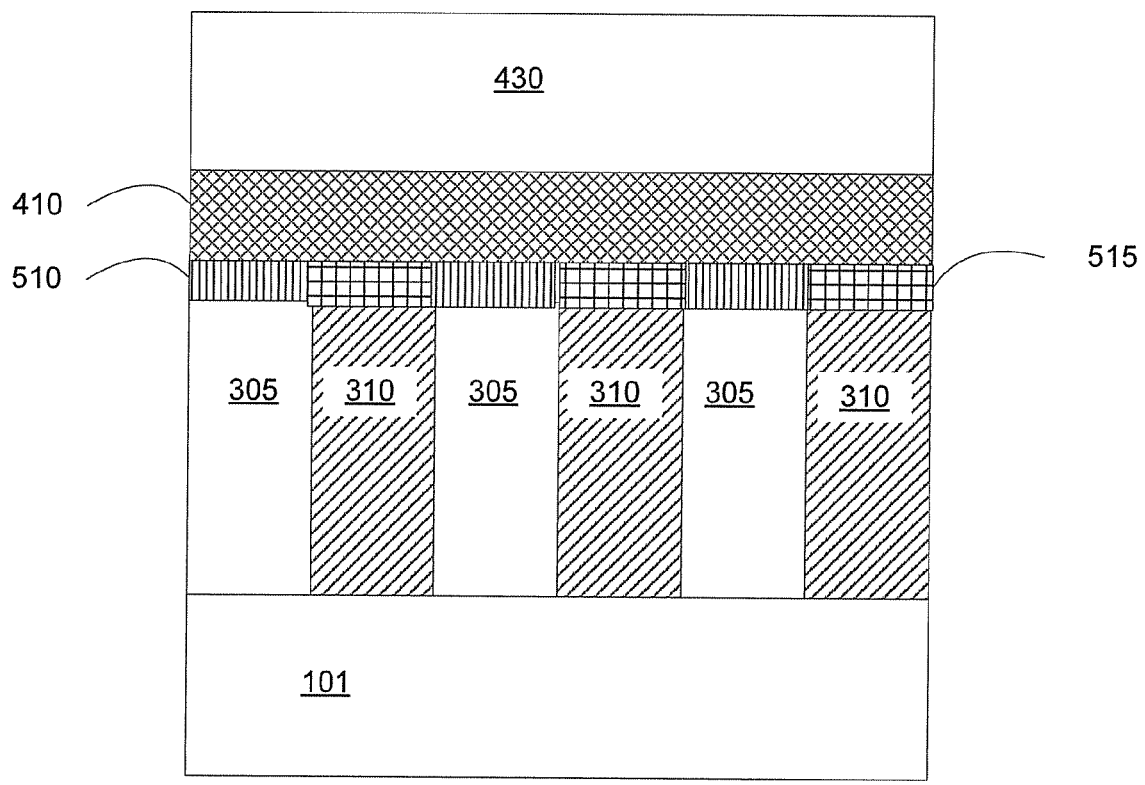
FIG. 5 is an illustration of a semiconductor structure in accordance with aspects of the innovations disclosed herein.

A further embodiment is shown in FIG. 5. As shown in FIG. 5, manganese is deposited to form the first cap layer 405 over both the interconnection lines 310 and the dielectric material 305, which can be a low-k material or silicon dioxide. As described above, the surfaces of the interconnection lines 310 have a copper oxide film formed thereon. Upon deposition of Mn over the interconnection lines 310, a reaction occurs between the deposited manganese and the copper oxide film present of the surfaces of the interconnection lines 310 to form a region of the first cap layer 405 having $MnO_x$ 510. The oxygen atoms or ions to form the $MnO_x$ 510 region originate from the copper oxide film present on the surfaces of the interconnection lines 310.

The deposited manganese can also react with the low-k material of the dielectric layer 305. Manganese deposited on the dielectric material 305 forms a region of the first cap layer 405 having MnSi$_y$O$_z$ (manganese silicon oxide) 515, where y is from about 1 to about 3 and z is from about 3 to about 5. MnSi$_y$O$_z$ is formed from the reaction of deposited manganese with the low-k material of the dielectric layer 305. Si atoms or ions and O atoms or ions forming MnSi$_y$O$_z$ originate from the dielectric layer 305 material.

As a result of the deposition of Mn, a region 510 of the first cap layer 405 contains MnO$_x$ and another region 515 of the first cap layer 405 contains MnSi$_y$O$_z$. That is, different regions of the first cap layer 405 can contain different oxidized manganese species depending upon whether deposition occurs over the interconnection lines 310 or over the dielectric layer 305 material present between the interconnection lines 310. The interface between MnSi$_y$O$_z$ and copper or a copper alloy of the interconnection lines 310 exhibits superior adhesion properties similar to the interface between MnO$_x$ and copper or a copper alloy.

The semiconductor structure having the first and second cap layers, described above, formed thereon can be incorporated into a variety of functional semiconductor devices. Those skilled in the art will recognize that many semiconductor devices employ a cap layer over a metalized dielectric layer, where the first and second cap layers described herein can be employed. The innovations disclosed herein are especially useful in the fabrication of memory semiconductor devices including random access memory (RAM) and NOR and NAND FLASH memory.

Figure 6:
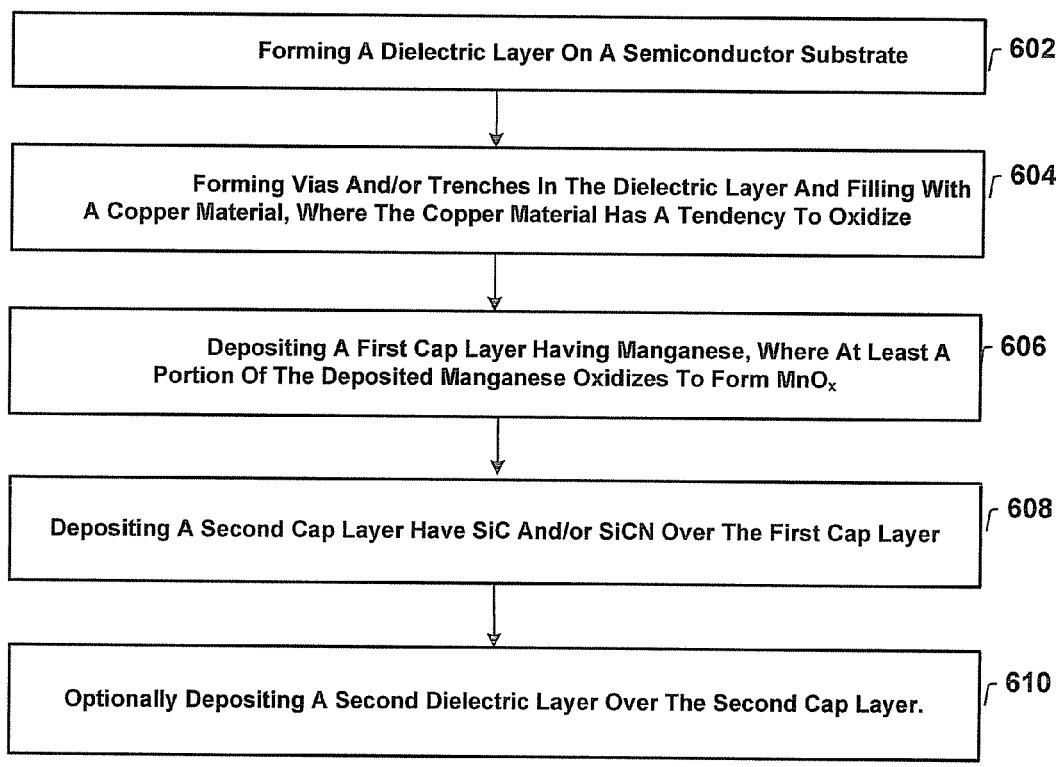
FIG. 6 shows a flow chart illustrating methods for forming a semiconductor structure with aspects of the innovations disclose herein.

In order to fully describe the innovations disclosed herein, acts for forming a cap layer having high adhesion without the use of plasma will be described in reference to FIG. 6. In act 602, a dielectric layer having silicon oxide or a low-k dielectric is formed on a semiconductor substrate. In act 604, one or more vias and/or trenches are formed in the dielectric layer and filled with a material having copper. Known metal barrier layers and/or adhesion layers can be placed in the vias and/or trenches prior to filling with a copper material. After filling the vias and/or trenches, unintended oxidation processes can cause a film of oxidized copper to form on the surface of the copper material. In act 606, a first cap layer of manganese is deposited over the dielectric layer and copper filled vias and/or trenches. The manganese reacts with the oxidized copper present on the surface of the copper filled vias and/or trenches such that at least a portion of the first cap layer has MnO$_x$. That is, at least a portion of the interface between the first cap layer and the interconnection lines is formed from MnO$_x$. In act 608, a second cap layer having silicon carbide (SIC) and/or nitrogen enriched silicon carbide (SiCN) is deposited over the first cap layer. In act 610, a second dielectric layer is optionally deposited over the second cap layer.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A method for manufacturing a semiconductor structure, comprising:
    forming a metallic interconnection line in a dielectric layer above a semiconductor substrate, the metallic interconnection line including a natural oxide film on a top surface of the metallic interconnection line;
    forming a first cap layer including Mn atoms or ions to cover at least a portion of the dielectric layer and at least a portion of the metallic interconnection line; and
    forming a second cap layer on the first cap layer, the second cap layer being an insulator,
    wherein the natural oxide film and the first cap layer react to form manganese oxide between the first cap layer and the interconnection line.

2. The method of claim 1, wherein the first cap layer is one or more selected from a manganese layer and a manganese oxide layer.

3. The method of claim 1, wherein elemental manganese is used to form the first cap layer.

4. The method of claim 1, wherein the natural oxide film and the first cap layer react before forming the second cap layer.

5. The method of claim 1, wherein the first cap layer after formation comprises one or more selected from manganese oxide, manganese silicon oxide, and oxidized manganese compounds.

6. The method of claim 1, wherein the metallic interconnection line comprises copper.

7. The method of claim 1, wherein the first cap layer after formation comprises manganese oxide.

8. The method of claim 1, wherein manganese present in the first cap layer reacts with oxidized copper present in the natural oxide film to reduce or eliminate the amount of oxidized copper present in the natural oxide film on the surface of the metallic interconnection line.

9. The method of claim 1, wherein the first cap layer has an average thickness from about 2 to about 10 nm.

10. The method of claim 1, the natural oxide film and the first cap layer react after forming the second cap layer.

11. A method for increasing the adhesion between a copper-containing interconnection line and a cap layer, comprising:
    providing a dielectric layer formed over a semiconductor substrate and having a copper interconnection line formed therein;
    depositing manganese to cover at least a portion of the dielectric layer having the copper-containing interconnection line formed therein and at least a portion of the copper-containing interconnection line to form a first cap layer; and
    depositing one or more material selected from silicon carbide and nitrogen enriched silicon carbide over the deposited manganese cap layer to form a second cap layer,
    wherein a portion of the interface between the copper-containing interconnection line and the first cap layer comprises manganese oxide, the manganese oxide formed by the reaction between a natural oxide film on a top surface of the copper-containing interconnection line and manganese present in the first cap layer.

12. The method of claim 11, wherein the first cap layer after deposition comprises one or more selected from manganese oxide, manganese silicon oxide, and oxidized manganese compounds.

13. The method of claim 11, wherein the dielectric layer comprises a low-k material.

14. The method of claim 11, wherein the low-k material has a dielectric constant that has not been increased due to plasma damage.

15. The method of claim 11, wherein the reaction between the natural oxide film and manganese present in the first cap layer reduces or eliminates the amount of oxidized copper present in the natural oxide film.

* * * * *